US009385665B2

(12) United States Patent
Toivonen et al.

(10) Patent No.: US 9,385,665 B2
(45) Date of Patent: Jul. 5, 2016

(54) PPA LINEARIZATION

(71) Applicant: Telefonaktiebolaget L M Ericsson (publ), Stockholm (SE)

(72) Inventors: Ossi Toivonen, Halikko (FI); Sami Vilhonen, Lieto (FI)

(73) Assignee: TELEFONAKTIEBOLAGET LM ERICSSON (PUBL), Stockholm (SE)

(*) Notice: Subject to any disclaimer, the term of this patent is extended or adjusted under 35 U.S.C. 154(b) by 48 days.

(21) Appl. No.: 14/187,480

(22) Filed: Feb. 24, 2014

(65) Prior Publication Data

US 2015/0244328 A1  Aug. 27, 2015

(51) Int. Cl.
*H03F 1/26* (2006.01)
*H03F 1/32* (2006.01)
(Continued)

(52) U.S. Cl.
CPC .......... *H03F 1/3241* (2013.01); *H03F 1/0266* (2013.01); *H03F 1/223* (2013.01); *H03F 1/3211* (2013.01); *H03F 1/3252* (2013.01); *H03F 3/19* (2013.01); *H03F 3/193* (2013.01); *H03F 3/21* (2013.01); *H03F 3/211* (2013.01); *H03F 3/24* (2013.01); *H03F 3/45071* (2013.01); *H03F 3/45179* (2013.01); *H03F 3/45183* (2013.01); *H03F 3/45201* (2013.01); *H03F 2200/102* (2013.01); *H03F 2200/18* (2013.01); *H03F 2200/24* (2013.01); *H03F 2200/405* (2013.01); *H03F 2200/453* (2013.01); *H03F 2200/465* (2013.01); *H03F 2200/541* (2013.01);
(Continued)

(58) Field of Classification Search
CPC ......... H03F 1/26; H03F 1/223; H03F 1/0222; H03F 2200/18; H03F 2200/102; H03F 2200/192; H03F 2200/222; H03F 2200/387; H03F 2200/451; H03F 2200/453; H03F 2200/456; H04B 2001/0441
USPC ......... 330/136, 149, 253, 261, 277, 295, 296, 330/311; 375/296, 297; 455/114.3
See application file for complete search history.

(56) References Cited

U.S. PATENT DOCUMENTS 5,420,536 A * 5/1995 Faulkner ............... H03C 3/406
330/129
7,474,149 B2 * 1/2009 Snelgrove ............. H03F 1/0205
330/129

(Continued)

OTHER PUBLICATIONS

Freescale Semiconductor, Technical Data, "RF Power Amplifier Lineup GaAs E—pHEMT Driving RF LDMOS", Design Support, Reference Designs, Rev. 0, Feb. 2012.*

(Continued)

*Primary Examiner* — Steven J Mottola
*Assistant Examiner* — Hafizur Rahman
(74) *Attorney, Agent, or Firm* — Coats & Bennett, PLLC

(57) ABSTRACT

A linearization circuit improves the linearity of a power amplifier based on an envelope of an input RF signal. The linearization circuit comprises an RF signal generation circuit, a replica circuit, and an adaptive amplifier. The RF signal generation circuit generates the RF signal from a phase and an amplitude of an input digital signal. The replica circuit extracts the envelope from the RF signal and generates a sensing voltage based on the extracted envelope. The adaptive amplifier generates an adaptive bias voltage for the power amplifier based on the sensing voltage, and applies the adaptive bias voltage to the power amplifier and to the replica circuit to improve the linearity of the power amplifier by regulating the power amplifier and the replica circuit according to the envelope.

17 Claims, 6 Drawing Sheets

(51) Int. Cl.
*H03F 3/19* (2006.01)
*H03F 3/21* (2006.01)
*H03F 3/45* (2006.01)
*H03F 1/02* (2006.01)
*H03F 1/22* (2006.01)
*H03F 3/193* (2006.01)
*H03F 3/24* (2006.01)

(52) U.S. Cl.
CPC ....... *H03F2200/555* (2013.01); *H03F 2200/78* (2013.01); *H03F 2203/45168* (2013.01); *H03F 2203/45224* (2013.01); *H03F 2203/45292* (2013.01); *H03F 2203/45394* (2013.01)

(56) References Cited

U.S. PATENT DOCUMENTS

| | | | | |
|---|---|---|---|---|
| 7,492,223 | B2* | 2/2009 | Behzad | H03F 1/3211 330/136 |
| 7,911,272 | B2* | 3/2011 | Sorrells | H03F 1/0294 330/107 |
| 7,986,186 | B2* | 7/2011 | Marbell | H03F 1/0222 330/136 |
| 2004/0032912 | A1 | 2/2004 | Ocenasek et al. | |
| 2005/0258898 | A1 | 11/2005 | Hongo | |
| 2008/0031383 | A1 | 2/2008 | Magoon et al. | |
| 2008/0139145 | A1 | 6/2008 | Behzad | |
| 2009/0251217 | A1 | 10/2009 | Keerti | |
| 2011/0050345 | A1 | 3/2011 | Quack et al. | |
| 2014/0085001 | A1* | 3/2014 | Anderson | H03F 1/0227 330/197 |
| 2014/0085007 | A1* | 3/2014 | Hadji-Abdolhamid | H03F 3/19 330/297 |
| 2014/0226748 | A1* | 8/2014 | Dorosenco | H04B 1/04 375/295 |

OTHER PUBLICATIONS

Sira, D., et al., "Process, Voltage and Temperature Compensation Technique for Cascode Modulated PAs", IEEE Transactions on Circuits and Systems—I: Regular Papers, Sep. 1, 2013, pp. 2511-2520, vol. 60, No. 9, IEEE.

Zheng, S., et al., "A CMOS WCDMA/WLAN Digital Polar Transmitter with AM Replica Feedback Linearization", IEEE Journal of Solid-State Circuits, Jul. 1, 2013, pp. 1701-1709, vol. 48, No. 7, IEEE.

\* cited by examiner

PPA LINEARIZATION

The solutions disclosed herein relate generally to power amplifiers, and more particularly to improving the linearity of power amplifiers

BACKGROUND

The performance of wireless transceivers relies heavily on the performance, e.g., linearity, efficiency, etc., of the amplifiers used by the wireless transceivers to amplify signals, e.g., for subsequent transmission. In order for a power amplifier to achieve good power efficiency, the voltage-swing of an input stage of the power amplifier needs to be relatively high. Typically, attaining such a high input voltage-swing while also maintaining good linearity at the input stage requires some kind of linearization circuitry in addition to the power amplifier circuitry. Further, to avoid compression and amplitude nonlinearity, voltage variations at the input stage need to be as small as possible. In practice, these goals require the amplifier to be implemented with large transistors, which is not ideal.

Digital pre-distortion and closed-loop polar architecture represent two types of conventional solutions for improving the linearity of a power amplifier. With a closed-loop polar architecture solution, the output of the power amplifier is down-converted based on a gain control and then compared with the phase and magnitude of the signal used to drive the power amplifier. Using such a closed-loop polar architecture solution may significantly reduce variations in the load, temperature, etc., of the power amplifier. However, the costs of such a solution are increased design complexity, larger chip area, and increased power consumption. With digital pre-distortion solutions, the nonlinearity of the power amplifier is first measured during calibration, and the input signal is pre-distorted properly to compensate for the measured power amplifier nonlinearity. While pre-distortion solutions may be less complex, require a smaller chip area, and may use less power relative to closed-loop power architecture solutions, digital pre-distortion solutions are sometimes less effective, especially when the system needs to operate in changing conditions, e.g., changing environmental conditions. Thus, there remains a need for improved linearization solutions that achieve a desired effectiveness over varying operating conditions without overly increasing the complexity, size, and/or power of the associated amplifier system.

SUMMARY

The solution disclosed herein improves the linearity of a power amplifier having an operational point set such that an average amplifier current increases with increasing input voltage, e.g., class B, class AB, and some class C amplifiers. To that end, the operations of the power amplifier are replicated, e.g., in a replica circuit, to extract an envelope of a radio frequency (RF) signal generated from a phase and amplitude of a digital input signal. The extracted envelope is then used to improve the linearity of the power amplifier when amplifying the RF signal.

In one exemplary embodiment, a linearization circuit improves linearity of a class B or class AB or class C power amplifier based on an envelope of an RF signal input to the power amplifier and generated from a phase and amplitude of an input digital signal. The exemplary linearization circuit comprises a replica circuit and an adaptive amplifier. The replica circuit is configured to extract the envelope from the RF signal, and to generate a sensing voltage based on the extracted envelope. The adaptive amplifier is operatively connected to the replica circuit and the power amplifier. The adaptive amplifier is configured to generate an adaptive bias voltage for the power amplifier based on the sensing voltage. The adaptive amplifier applies the adaptive bias voltage to the power amplifier and to the replica circuit to improve the linearity of the power amplifier by regulating the power amplifier and the replica circuit according to the envelope. An operational point of the power amplifier is set such that an average amplifier current increases with increasing input voltage amplitude.

In another exemplary embodiment, an amplifier system comprises a power amplifier, an RF signal generation circuit, and a linearization circuit. The power amplifier has an operational point set such that an average amplifier current increases with increasing input voltage amplitude. The RF signal generation circuit is operatively connected to the power amplifier and is configured to generate an RF signal from a phase and amplitude of a digital signal input to the RF signal generation circuit. The linearization circuit is for improving linearity of the power amplifier based on an envelope of the RF signal input to the power amplifier, where the linearization circuit comprises a replica circuit and an adaptive amplifier. The replica circuit is operatively connected to the RF signal generation circuit. The replica circuit is configured to extract the envelope from the RF signal, and to generate a sensing voltage based on the extracted envelope. The adaptive amplifier is operatively connected to the replica circuit and the power amplifier. The adaptive amplifier is configured to generate an adaptive bias voltage for the power amplifier based on the sensing voltage, wherein the adaptive amplifier applies the adaptive bias voltage to the power amplifier and to the replica circuit to improve the linearity of the power amplifier by regulating the power amplifier and the replica circuit according to the envelope.

According to another exemplary embodiment, a method of improving linearity of a class B or class AB or class C power amplifier is based on an envelope of an analog RF signal input to the power amplifier and generated from a phase and amplitude of an input digital signal. The method comprises extracting the envelope from the RF signal and generating a sensing voltage based on the extracted envelope. The method also comprises generating an adaptive bias voltage for the power amplifier based on the sensing voltage, wherein the adaptive bias voltage is applied to the power amplifier to improve the linearity of the power amplifier by regulating the power amplifier and the replica circuit according to the envelope, and wherein an operational point of the power amplifier is set such that an average amplifier current increases with increasing input voltage amplitude.

DETAILED DESCRIPTION

Controlling the linearity of a power amplifier in a transceiver is critical to improving the performance of the transceiver as a whole. As used herein the term "power amplifier" refers to any amplifier that outputs more power than applied at the input. In some embodiments, the power amplifier may comprise a pre-power amplifier (e.g., an amplifier used before additional amplification to boost an input signal power without degrading the signal-to-noise ratio), an amplifier cell in a power amplifier array of amplifier cells (e.g., an array of pre-power amplifier cells), the last amplifier before the antenna of a wireless transceiver, etc. It will be appreciated, however, that the power amplifier discussed herein could be any amplifier used to increase the power of a signal.

Conventional solutions for improving the linearity of a power amplifier include the already discussed digital predistortion and closed-loop polar architecture solutions. Another possible solution, improves the linearity by tracking the envelope of the RF signal applied to the power amplifier when the input stage of the power amplifier is operating in the linear region. In conventional solutions, this envelope tracking may be achieved by replicating the envelope of the RF signal applied to a power amplifier by processing a low-frequency analog signal generated from only the amplitude of a digital input signal (referred to herein as an amplitude modulation signal). This replicated envelope is used as a basis for regulating the bias of the power amplifier. The power amplifier then amplifies an amplitude and phase modulated RF signal responsive to the applied bias voltage, where the amplitude and phase modulated RF signal is generated from the amplitude and phase of the digital input signal. The most substantial disadvantage of this solution is the increased design complexity and circuit footprint required to implement each solution. For example, this solution requires circuitry to produce the amplitude and phase modulated RF signal applied to the power amplifier, and circuitry to produce the amplitude modulation signal used to replicate the RF envelope.

The solution presented herein uses a single RF signal generator to provide an amplitude and phase modulated RF signal to both the power amplifier and a replica circuit used to replicate the envelope of the RF signal. As a result, not only does the solution disclosed herein have less complexity and a smaller footprint, it also enables the bandwidth requirements of the linearization circuit to be relaxed, as discussed further below.

Figure 1:
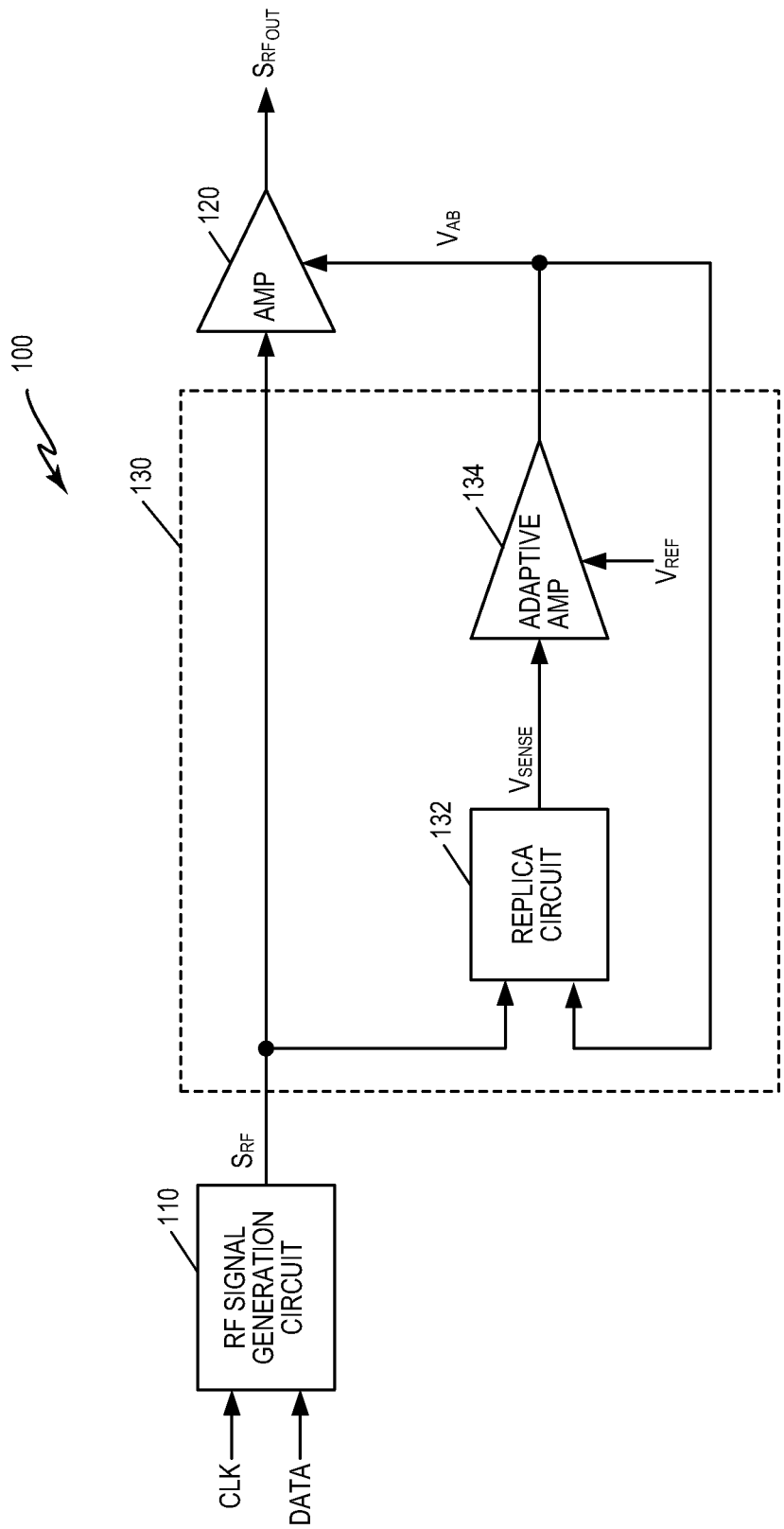
FIG. 1 shows a block diagram for an amplifier system according to one exemplary embodiment.

FIG. 1 shows a block diagram of an exemplary amplifier system 100 comprising an RF signal generation circuit 110, a power amplifier 120, and a linearization circuit 130 for improving the linearity of the power amplifier 120. The RF signal generation circuit 110 generates an RF signal from the amplitude and phase of an input digital signal DATA. More particularly, the RF signal generation circuit 110 converts the input data bits to an analog signal at the desired radio frequency ($S_{RF}$). The power amplifier 120 amplifies $S_{RF}$ so as to output an RF signal $S_{RFout}$ having a greater power than that of $S_{RF}$. To that end, the operational point of the power amplifier 120 is set such that an average amplifier current increases with increasing input voltage amplitude. Exemplary power amplifiers 120 include class B, class AB, and class C amplifiers.

The linearization circuit 130 disclosed herein improves the linearity of the power amplifier 120 by controlling the bias applied to the power amplifier 120. To that end, the linearization circuit 130 comprises a replica circuit 132 and an adaptive amplifier 134. Using the same RF signal $S_{RF}$ applied to the power amplifier 120, the replica circuit 132 extracts the envelope of the RF signal by replicating at least some of the operations of the power amplifier 120. More particularly, replica circuit 132 turns the RF signal into a low frequency signal representing the RF envelope to enable the extraction of the RF envelope. Based on the extracted envelope, the replica circuit 132 generates a sensing voltage $V_{sense}$, which represents an operating point variation of the power amplifier 120, i.e., how much the operating conditions of an input stage of the power amplifier 120 varies as the input envelope varies. The adaptive amplifier 134 generates an adaptive bias voltage $V_{AB}$ for the power amplifier based on $V_{sense}$, where $V_{AB}$ represents a control voltage for the power amplifier 120 that sets the operating point of the power amplifier 120. A reference voltage $V_{ref}$ is also be applied to the adaptive amplifier 134 to tune the adaptive amplifier 134, where $V_{ref}$ represents the desired level for $V_{sense}$. The adaptive bias voltage is also fed back to an input of the replica circuit 132. By applying $V_{AB}$ to the power amplifier 120 and also feeding $V_{AB}$ back to the replica circuit 132, the adaptive amplifier 132 is able to regulate the power amplifier 120 and the replica circuit 132 according to the extracted envelope, and therefore, improves the linearity of the power amplifier 120.

Figure 2:
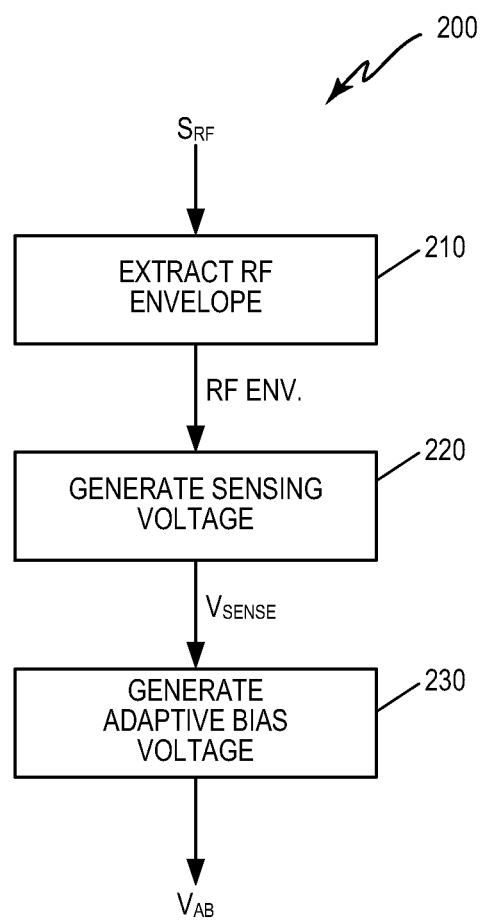
FIG. 2 shows a method of improving the linearity of a power amplifier according to one exemplary embodiment.

FIG. 2 shows an exemplary method 200 for improving the linear operations of the power amplifier 120. In the exemplary method 200, an RF signal $S_{RF}$ generated from the phase and amplitude of a digital input signal is applied to the linearization circuit 130. From this input $S_{RF}$, the linearization circuit 130 extracts the envelope of the RF signal (block 210), and generates a sensing voltage $V_{sense}$ based on the extracted envelope (block 220). The linearization circuit 130 then generates an adaptive bias voltage $V_{AB}$ based on $V_{sense}$ (block 230). The output adaptive bias voltage $V_{AB}$ is applied to the power amplifier 120 and fed back to the replica circuit 132 in the linearization circuit 130 as previously discussed.

Figure 3:
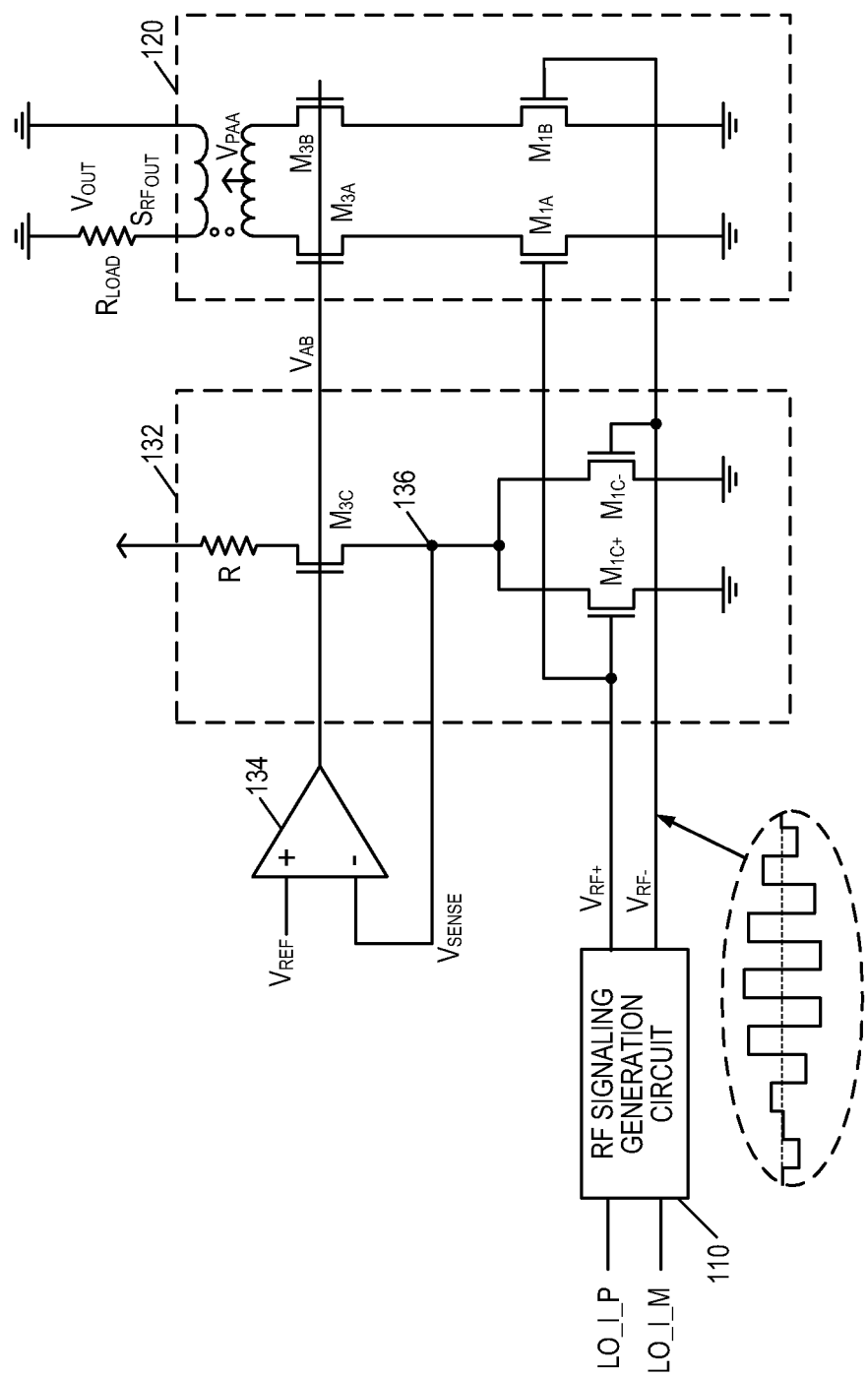
FIG. 3 shows a circuit diagram for an exemplary implementation of the amplifier system of FIG. 1.

FIG. 3 shows an exemplary circuit diagram for the amplifier system 100 of FIG. 1. As shown in FIG. 3, one exemplary implementation of the replica circuit 132 comprises a differential input transconductance stage comprising a positive half-cell transistor M1C+ and a negative half-cell transistor M1C−. The RF signal generation circuit 110 generates an RF signal comprising a positive RF signal $S_{RF+}$ and a negative RF signal $S_{RF−}$ from the amplitude and phase of the digital input signal. The positive RF signal $S_{RF+}$ is applied to an input of the positive half-cell transistor M1C+, and the negative RF signal $S_{RF−}$ is applied to an input of the negative half-cell transistor M1−. The outputs of the differential input transconductance stage are connected at node 136 to provide $V_{sense}$ to the adaptive amplifier 134, and therefore to provide an output voltage ($V_{sense}$) to an input of the adaptive amplifier 134.

As also shown in FIG. 3, one exemplary implementation of the power amplifier 120 also comprises a differential input transconductance stage comprising a positive half-cell transistor M1A and a negative half-cell transistor M1B, where the positive RF signal $S_{RF+}$ is applied to an input of the positive half-cell transistor M1A, and the negative RF signal $S_{RF−}$ is applied to an input of the negative half-cell transistor M1B. In one exemplary embodiment, the input stage transistors for both the power amplifier 120 and the replica circuit 132 operate in saturation mode. The adaptive bias voltage $V_{AB}$ output by the adaptive amplifier 134 responsive to $V_{sense}$ is provided to a second input of the replica circuit 132, i.e., the gate of transistor M3C, and therefore impacts the drains of the half-cell transistors M1C+, M1C− of the differential input transconductance stage of the replica circuit 132. The adaptive amplifier 134 also applies $V_{AB}$ to a bias input of the power amplifier 120, i.e., the gates of cascade transistors M3A and M3B, which in turn drive the drains of the half-cell transistors M1A, M1B of the power amplifier 120. Boosting the cascade transistors M3A, M3B with $V_{AB}$ reduces the transconductance requirements of these transistors, which enables smaller transistors to be used for these cascade transistors M3A, M3B without sacrificing performance. Further, smaller cascade transistors results in lower parasitic capacitance at the output. Thus, not only does this embodiment derive the adaptive bias voltage from the RF signal input to the amplifier, and thus reduces the complexity and power requirements by requiring only one signal generation circuit, but it also reduces the size of the circuit required for implementation relative to conventional solutions.

Figure 4:
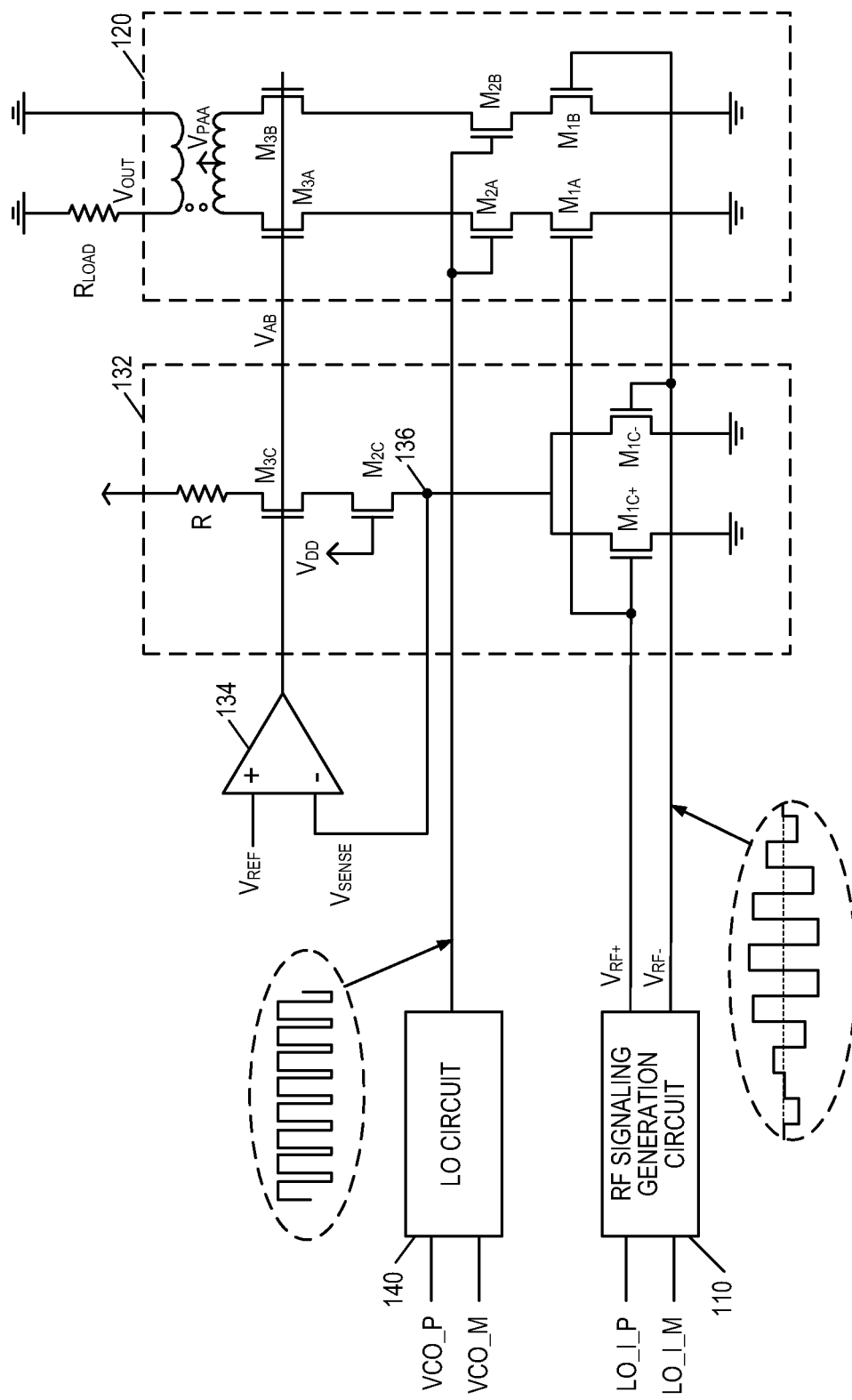
FIG. 4 shows a circuit diagram for another exemplary implementation of the amplifier system of FIG. 1.
Figure 5:
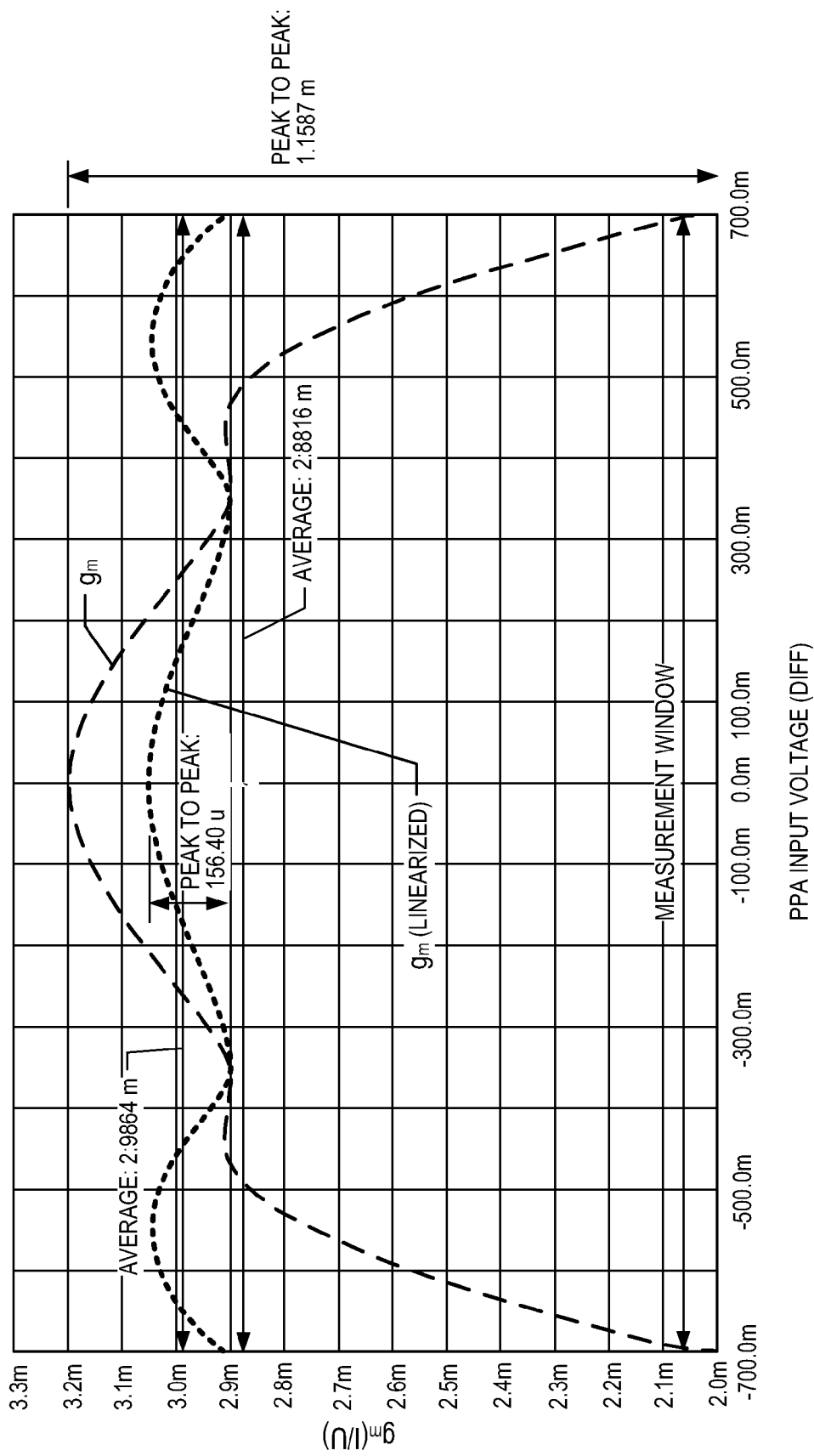
FIG. 5 shows transconductance results of power amplifier linearized according to the solution disclosed herein relative to a power amplifier not subjected to any linearization techniques.

FIG. 4 shows another exemplary circuit diagram for the amplifier system 100 of FIG. 1. In this embodiment, the replica circuit 132 further includes a second cascade stage transistor M2C, and the power amplifier 120 further includes a second cascade stage comprising first and second cascade transistors M2A, M2B. With this implementation, the M2 transistors increase the total impedance of the cascade stage (M2 and M3 transistors), and thus decreases the total transconductance seen by the input stage. During the negative half cycle of the RF signal, the voltage of the RF signal swings below the bias point of the power amplifier 120, which as a result generates no output current. A local oscillator circuit 140 samples the RF signal at twice a local oscillator frequency at the power amplifier 120 to exclude any jitter from the output of the RF signal generation circuit 110. Because the input voltage levels are quite high, the transconductance ratio between the cascade transistors M2A, M2B of the power amplifier 120 and the input transistors M1A, M1B of the power amplifier 120 should also be high to avoid compression and amplitude nonlinearity at the input stage. Further, because cascade transistors M2A, M2B are used only to gate the signal, the channel length of these transistors can be kept at a minimum. As a result, the transconductance for cascade transistors M2A, M2B can be pretty high. The linearization solution disclosed herein is performed by adaptively changing the drain voltage of the cascade transistors M2A, M2B responsive to the extracted RF envelope, e.g., by providing $V_{AB}$ to the gates of transistors M3A, M3B, which drives the drains of the cascade transistors M2A, M2B. Higher RF signal values effectively increase the transconductance ($g_m$) of the cascade transistors M3A, M3B by effectively increasing the gate bias voltage of the cascade transistors M3A, M3B. This allows the cascade transistors M3A, M3B to have a smaller size, while at the same time having a smaller compression and a larger effective transconductance for the cascade transistors (M2 and M3 transistors) of the power amplifier 120, i.e., the transconductance of the input stage does not vary as much as without the linearization, as shown in FIG. 5, which effectively increases the linearity of the power amplifier.

Figure 6:
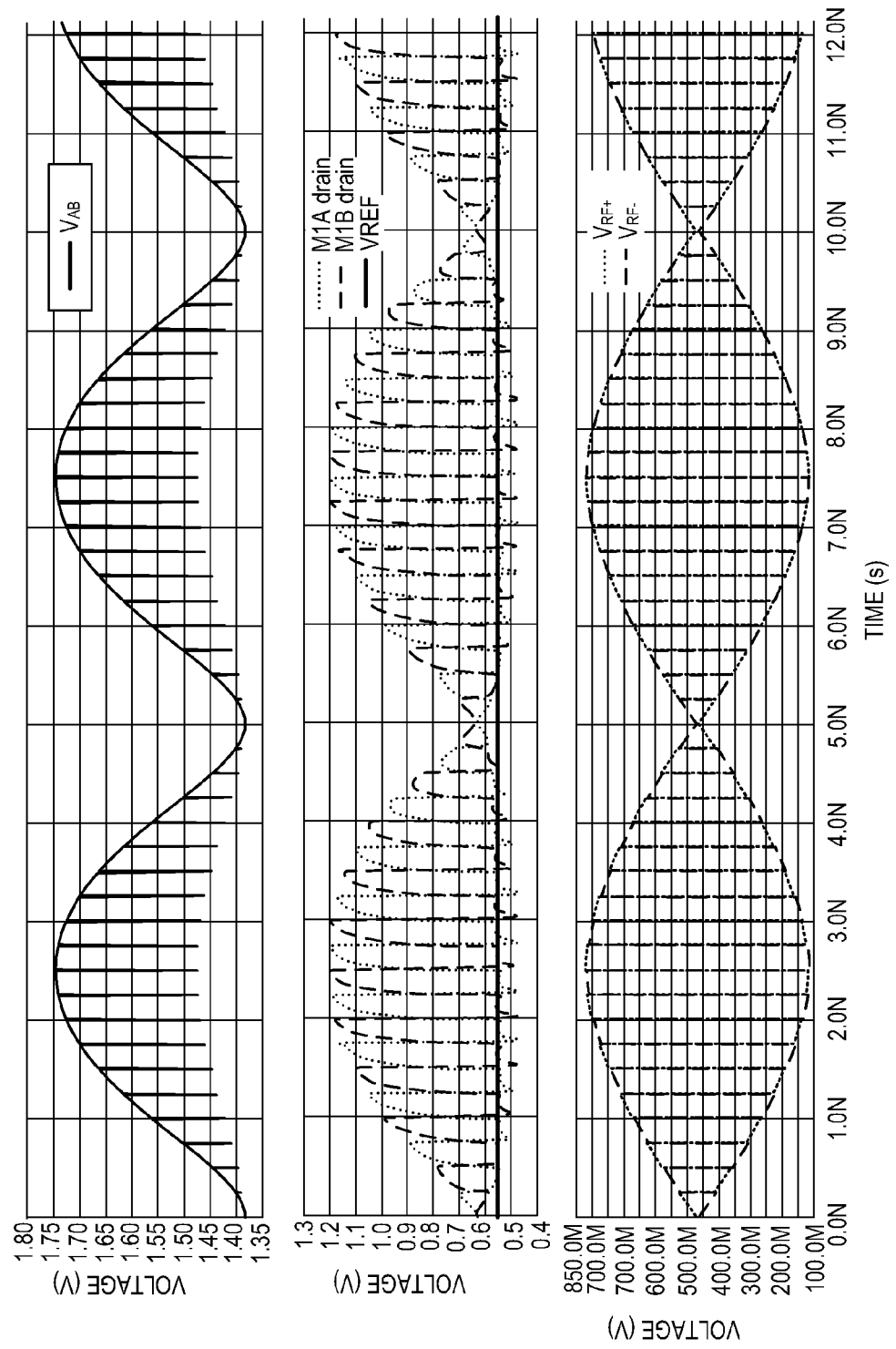
FIG. 6 shows simulation regarding the RF envelope for the solution disclosed herein.

It will be appreciated that changes in the RF envelope are reflected by $V_{sense}$, which is used by the adaptive amplifier 134 to correct such changes. The adaptive amplifier 134, which follows the envelope shape, has relaxed bandwidth requirement because there is small bias current applied to both branches (e.g., for both the positive branch and the negative branch of the power amplifier 120 and the replica circuit 132) at the zero RF signal values, which smooths the transition point significantly as can be seen by the middle graph of FIG. 6 relative to the bottom graph of FIG. 6. More particularly, because input transistors M1C+, M1C− are biased with a small bias current, both input transistors M1C+, M1C− conduct current, which prevents the transistor current of M3C from reaching zero, keeping the output of the adaptive amplifier smooth, as shown by $V_{AB}$ in the top graph of FIG. 6. This smoothness enables the adaptive amplifier 134 to operate with relaxed bandwidth requirements.

When used with an IQ modulator, where the power amplifier 120 comprises an In-phase power amplifier and a Quadrature power amplifier, the linearization solution disclosed herein comprises two linearization paths, an In-phase and a Quadrature path, connected in parallel. In this case, the In-phase path improves the linearity of the In-phase power amplifier based on the envelope of an In-phase portion of the RF signal, and the Quadrature path improves the linearity of the Quadrature power amplifier based on the envelope of a Quadrature portion of the RF signal. To that end, the In-phase path comprises an In-phase version of the linearization circuit 130 of FIG. 1, and the Quadrature path comprises a Quadrature version of the linearization circuit 130 of FIG. 1. More particularly, the In-phase path comprises an In-phase replica circuit 132 operatively connected to an In-phase output of the RF signal generation circuit 110, and an In-phase adaptive amplifier 134 operatively connected to the In-phase replica circuit 132 and the In-phase power amplifier 120. Similarly, the Quadrature path comprises a Quadrature replica circuit 132 operatively connected to a Quadrature output of the RF signal generation circuit 110, and a Quadrature adaptive amplifier 134 operatively connected to the Quadrature replica circuit 132 and the Quadrature power amplifier 120.

As noted above, the power amplifier discussed herein may comprise one or more power amplifier cells, e.g., as found in a power amplifier array. In this case, the RF signal, and the adaptive bias voltage determined by the linearization circuit 130, are applied to each of the power amplifier cells to improve the linearity of each power amplifier cell.

By passing the same RF signal through both the linearization circuit 130 disclosed herein and the power amplifier 120, the linearization solution disclosed herein has a significantly reduced complexity and footprint relative to past solutions.

Various elements disclosed herein are described as some kind of circuit, e.g., a RF signal generation circuit, a linearization circuit, a replica circuit, a local oscillator circuit, etc. Each of these circuits may be embodied in hardware and/or in software (including firmware, resident software, microcode, etc.) executed on a controller or processor, including an application specific integrated circuit (ASIC). Further, various elements disclosed herein are described as some type of amplifier, e.g., a power amplifier, an adaptive amplifier, etc. It will be appreciated that each of these amplifiers represents a type of circuit embodied in hardware.

While the details of the solution disclosed herein are described in terms of NMOS transistors, it will be appreciated that the solution disclosed herein may alternatively be implemented with PMOS transistors.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A linearization circuit for improving linearity of a class B or class AB or class C power amplifier based on an envelope of a radio frequency (RF) signal input to the power amplifier and generated from a phase and amplitude of an input digital signal, the linearization circuit comprising:

a replica circuit configured to receive the generated RF signal and configured to extract the envelope from the RF signal, and generate a sensing voltage based on the extracted envelope; and an adaptive amplifier operatively connected to the replica circuit and the power amplifier, the adaptive amplifier configured to generate an adaptive bias voltage for the power amplifier based on the sensing voltage;

wherein the adaptive amplifier applies the adaptive bias voltage to the power amplifier and to the replica circuit to improve the linearity of the power amplifier by regulating the power amplifier and the replica circuit according to the envelope; and wherein an operational point of the power amplifier is set such that an average amplifier current increases with increasing amplitude of the RF signal.

2. The linearization circuit of claim 1 wherein the power amplifier comprises a pre-power amplifier.

3. The linearization circuit of claim 1 wherein the power amplifier comprises a plurality of power amplifier cells, and wherein the RF signal and the adaptive bias voltage are applied to each of the power amplifier cells to improve the linearity of each of the power amplifier cells.

4. The linearization circuit of claim 1 wherein:

the power amplifier comprises an In-phase power amplifier and a Quadrature power amplifier connected in parallel; and the linearization circuit comprises an In-phase path for improving the linearity of the In-phase power amplifier based on the envelope of an In-phase portion of the RF signal connected in parallel with a Quadrature path for improving the linearity of the Quadrature power amplifier based on the envelope of a Quadrature portion of the RF signal;

the In-phase path comprises an In-phase replica circuit configured to receive the In-phase portion of the RF signal, and an In-phase adaptive amplifier operatively connected to the In-phase replica circuit and the In-phase power amplifier; and the Quadrature path comprises a Quadrature replica circuit configured to receive the Quadrature portion of the RF signal, and a Quadrature adaptive amplifier operatively connected to the Quadrature replica circuit and the Quadrature power amplifier.

5. The linearization circuit of claim 1 wherein the replica circuit comprises:

a differential input transconductance stage comprising a positive half-cell transistor and a negative half-cell transistor;

wherein the RF signal comprises a positive RF signal and a negative RF signal;

wherein the positive RF signal is applied to an input of the positive half-cell transistor and the negative RF signal is applied to an input of the negative half-cell transistor; and wherein outputs of the differential input transconductance stage are connected to provide the sensing voltage to an input of the adaptive amplifier.

6. An amplifier system comprising:

a power amplifier, wherein an operational point of the power amplifier is set such that an average amplifier current increases with increasing amplitude of an RF signal input to the power amplifier;

an RF signal generation circuit operatively connected to the power amplifier 20 and configured to generate an RF signal from a phase and amplitude of a digital signal input to the RF signal generation circuit; and a linearization circuit for improving linearity of the power amplifier based on an envelope of the radio frequency (RF) signal input to the power amplifier, the linearization circuit comprising:

a replica circuit operatively connected to the RF signal generation circuit, the replica circuit configured to extract the envelope from the RF signal, and generate a sensing voltage based on the extracted envelope; and a adaptive amplifier operatively connected to the replica circuit and the power amplifier, the adaptive amplifier configured to generate an adaptive bias voltage for the power amplifier based on the sensing voltage, wherein the adaptive amplifier applies the adaptive bias voltage to the power amplifier and to the replica circuit to improve the linearity of the power amplifier by regulating the power amplifier and the replica circuit according to the envelope.

7. The amplifier system of claim 6 wherein the power amplifier comprises a pre-power amplifier.

8. The amplifier system of claim 6 wherein the power amplifier comprises a plurality of power amplifier cells, and wherein the RF signal and the adaptive bias voltage are applied to each of the power amplifier cells to improve the linearity of each of the power amplifier cells.

9. The amplifier system of claim 6 wherein:

the power amplifier comprises an In-phase power amplifier and a Quadrature power amplifier connected in parallel; and the linearization circuit comprises an In-phase path for improving the linearity of the In-phase power amplifier based on the envelope of an In-phase portion of the RF signal connected in parallel with a Quadrature path for improving the linearity of the Quadrature power amplifier based on the envelope of a Quadrature portion of the RF signal;

the In-phase path comprises an In-phase replica circuit operatively connected to the an In-phase output of the RF signal generation circuit, and an In-phase adaptive amplifier operatively connected to the In-phase replica circuit and the In-phase power amplifier; and the Quadrature path comprises a Quadrature replica circuit operatively connected to a Quadrature output of the RF signal generation circuit, and a Quadrature adaptive amplifier operatively connected to the Quadrature replica circuit and the Quadrature power amplifier.

10. The amplifier system of claim 9 wherein the replica circuit comprises:

a differential input transconductance stage comprising a positive half-cell transistor and a negative half-cell transistor;

wherein the RF signal comprises a positive RF signal and a negative RF signal;

wherein the positive RF signal is applied to an input of the positive half-cell transistor and the negative RF signal is applied to an input of the negative half-cell transistor; and wherein the outputs of the differential transconductance stage are connected to provide the sensing voltage to an input of the adaptive amplifier.

11. A method of improving linearity of a class B or class AB or class C power amplifier based on an envelope of an analog radio frequency (RF) signal input to the power amplifier and generated from a phase and amplitude of an input digital signal, the method comprising:

extracting the envelope from the RF signal and generating a sensing voltage based on the extracted envelope; and generating an adaptive bias voltage for the power amplifier based on the sensing voltage;

wherein the adaptive bias voltage is applied to the power amplifier to improve the linearity of the power amplifier by regulating the power amplifier and the replicating operations according to the envelope; and wherein an operational point of the power amplifier is set such that an average amplifier current increases with increasing amplitude of the RF signal input to the power amplifier.

12. A transceiver comprising an amplifier system, said amplifier system comprising:

a power amplifier, wherein an operational point of the power amplifier is set such that an average amplifier current increases with increasing amplitude of an RF signal input to the power amplifier;

an RF signal generation circuit operatively connected to the power amplifier 20 and configured to generate an RF signal from a phase and amplitude of a digital signal input to the RF signal generation circuit; and a linearization circuit for improving linearity of the power amplifier based on an envelope of the radio frequency (RF) signal input to the power amplifier, the linearization circuit comprising:

a replica circuit operatively connected to the RF signal generation circuit, the replica circuit configured to extract the envelope from the RF signal, and generate a sensing voltage based on the extracted envelope; and a adaptive amplifier operatively connected to the replica circuit and the power amplifier, the adaptive amplifier configured to generate an adaptive bias voltage for the power amplifier based on the sensing voltage, wherein the adaptive amplifier applies the adaptive bias voltage to the power amplifier and to the replica circuit to improve the linearity of the power amplifier by regulating the power amplifier and the replica circuit according to the envelope.

13. The transceiver of claim 12 wherein the power amplifier comprises a pre-power amplifier.

14. The transceiver of claim 12 wherein the power amplifier comprises a plurality of power amplifier cells, and wherein the RF signal and the adaptive bias voltage are applied to each of the power amplifier cells to improve the linearity of each of the power amplifier cells.

15. The transceiver of claim 12 wherein:

the power amplifier comprises an In-phase power amplifier and a Quadrature power amplifier connected in parallel; and the linearization circuit comprises an In-phase path for improving the linearity of the In-phase power amplifier based on the envelope of an In-phase portion of the RF signal connected in parallel with a Quadrature path for improving the linearity of the Quadrature power amplifier based on the envelope of a Quadrature portion of the RF signal;

the In-phase path comprises an In-phase replica circuit operatively connected to the an In-phase output of the RF signal generation circuit, and an In-phase adaptive amplifier operatively connected to the In-phase replica circuit and the In-phase power amplifier; and the Quadrature path comprises a Quadrature replica circuit operatively connected to a Quadrature output of the RF signal generation circuit, and a Quadrature adaptive amplifier operatively connected to the Quadrature replica circuit and the Quadrature power amplifier.

16. The transceiver of claim 15 wherein the replica circuit comprises:

a differential input transconductance stage comprising a positive half-cell transistor and a negative half-cell transistor;

wherein the RF signal comprises a positive RF signal and a negative RF signal;

wherein the positive RF signal is applied to an input of the positive half-cell transistor and the negative RF signal is applied to an input of the negative half-cell transistor; and wherein the outputs of the differential transconductance stage are connected to provide the sensing voltage to an input of the adaptive amplifier.

17. The linearization circuit of claim 1 wherein the sensing voltage represents an operating point of the power amplifier generated from the extracted envelope.

* * * * *